United States Patent
Schmidt

(10) Patent No.: US 7,245,062 B2
(45) Date of Patent: Jul. 17, 2007

(54) DEVICE FOR CONVERTING MECHANICAL ENERGY INTO ELECTRICAL ENERGY

(75) Inventor: Frank Schmidt, Zorneding (DE)

(73) Assignee: EnOcean GmbH, Oberhaching (DE)

( * ) Notice: Subject to any disclaimer, the term of this patent is extended or adjusted under 35 U.S.C. 154(b) by 0 days.

(21) Appl. No.: 10/514,323

(22) PCT Filed: May 7, 2003

(86) PCT No.: PCT/DE03/01468

§ 371 (c)(1),
(2), (4) Date: May 31, 2005

(87) PCT Pub. No.: WO03/096521

PCT Pub. Date: Nov. 20, 2003

(65) Prior Publication Data

US 2005/0253486 A1   Nov. 17, 2005

(30) Foreign Application Priority Data

May 14, 2002   (DE) ................................ 102 21 420

(51) Int. Cl.
*H02N 1/04* (2006.01)
*H02N 2/00* (2006.01)
*H01L 41/00* (2006.01)
(52) U.S. Cl. ........................ 310/330; 310/331; 290/1 R
(58) Field of Classification Search ................. 310/330, 310/331, 337, 338, 308, 309, 339; 290/1 R
See application file for complete search history.

(56) References Cited

U.S. PATENT DOCUMENTS

| 3,500,451 | A | * | 3/1970 | Yando ........................ 310/330 |
| 3,641,373 | A | * | 2/1972 | Elkuch ........................ 310/309 |
| 4,110,654 | A | * | 8/1978 | Paul ........................ 310/323.21 |
| 4,342,936 | A | * | 8/1982 | Marcus et al. ............... 310/330 |
| 4,515,016 | A | * | 5/1985 | Hartemann et al. ....... 73/514.28 |
| 6,046,528 | A | * | 4/2000 | LaForest et al. ............ 310/339 |
| 6,336,366 | B1 | * | 1/2002 | Thundat et al. .......... 73/514.34 |
| 6,479,920 | B1 | * | 11/2002 | Lal et al. ..................... 310/309 |
| 6,703,761 | B2 | * | 3/2004 | Gallmeyer et al. .... 310/316.01 |
| 6,933,660 | B2 | * | 8/2005 | Maushard et al. .......... 310/331 |
| 2002/0109435 | A1 | * | 8/2002 | Cotton, III .................. 310/328 |

(Continued)

FOREIGN PATENT DOCUMENTS

DE   33 90 497 C2   12/1984

(Continued)

OTHER PUBLICATIONS

Voigt Konrad, Hermsdorf, Plezo-Power with Utmost Lifetime, Aug. 1999, p. 30—Original and Translated Document.*

(Continued)

*Primary Examiner*—Julio C. Gonzalez
(74) *Attorney, Agent, or Firm*—Cohen Pontani Lieberman & Pavane LLP

(57) ABSTRACT

An apparatus for conversion of mechanical energy to electrical energy having a piezo transducer (1), which is formed from two or more layers, and having a mass/spring system (2, 3, 4), which can oscillate, in a holder (5), which is caused (6) to oscillate mechanically when stimulated, which oscillations periodically deform the piezo transducer such that an alternating voltage occurs on the connecting wires (7) of the transducer.

12 Claims, 1 Drawing Sheet

U.S. PATENT DOCUMENTS

| | | | |
|---|---|---|---|
| 2004/0140733 A1* | 7/2004 | Keller | 310/309 |
| 2004/0145271 A1* | 7/2004 | Potter | 310/309 |

FOREIGN PATENT DOCUMENTS

| | | |
|---|---|---|
| DE | 41 26 456 A1 | 2/1993 |
| DE | 44 22 309 A1 | 2/1996 |
| DE | 196 01 917 A | 7/1997 |
| JP | 403009581 A * | 1/1991 |
| JP | 11 146663 A | 5/1999 |
| JP | 411146663 A * | 5/1999 |
| WO | WO 98/36395 | 8/1998 |
| WO | WO 01/35470 A | 5/2001 |
| WO | WO 02/29965 | 4/2002 |

OTHER PUBLICATIONS

Konrad Voight, "Piezo-Power mit hochster Lebensdauer", F&M Antriebstechnik, Carl Hanser Verlag, Jahrgang 107 (1999), 4, pp. 30.

* cited by examiner

DEVICE FOR CONVERTING MECHANICAL ENERGY INTO ELECTRICAL ENERGY

RELATED APPLICATIONS

This is a U.S. national stage of application No. PCT/DE2003/001468, filed on 7 May 2003.

This patent application claims the priority of German patent application no. 102 21 420.4, filed 14 May 2002, the disclosure content of which is hereby incorporated by reference.

FIELD OF THE INVENTION

The invention relates to an apparatus for conversion of mechanical energy to electrical energy having a piezo transducer, whose deformation results in an electrical voltage being formed.

BACKGROUND OF THE INVENTION

In the case of an apparatus which is known from WO 98/36395, an electrical voltage, which results from charge displacements in the piezoelectric material of the transducer, is produced by mechanical deformation of a piezo transducer.

The known apparatus contains a wire-free radio switch which makes use of process energy and has a piezo-electric transducer to which finger pressure can be applied and which produces an electrical voltage. An identification number and sensor information can be applied to the radio-frequency signal produced by the switch. In this invention, mechanical energy is in each case converted to electrical energy by a single mechanical deformation of the piezoelectric transducer by using a mechanical operating apparatus with a beyond dead center spring which suddenly applies the mechanical prestress that has been set to the transducer when it is loaded beyond the dead center position.

SUMMARY OF THE INVENTION

One object of the present invention is to provide an apparatus in which both individual oscillation or compression processes can be converted to electrical energy, and continuously and dynamically changing oscillations can be converted to electrical energy.

This and other objects can be attained in accordance with one aspect of the invention directed to an apparatus for conversion of mechanical energy to electrical energy which comprises at least one electrovolumetric transducer element, a mass which can oscillate, and at least one transmission element for transmission of oscillations. The transducer element is in engagement with the transmission element such that any oscillation of the mass can be transformed at least partially to a change in the volume of the transducer element, producing an electrical voltage.

The transmission element may in this case be in the form of an elastic element, in particular a spring element in the form of a lever or in the form of a bending beam. However, the transmission element may also be in the form of an apparatus which transmits oscillations by means of a fluid. It can be clamped in a holder on one end and/or may have a freely oscillating subarea which can make mechanical contact with an oscillating mass. The "freely oscillating subarea" may in general be understood to be a region of the transmission element which is not clamped in or inserted firmly but can be brought into contact with an oscillating mass, or is connected to this mass.

The mass which can oscillate may also itself be at least part of the transmission element. The transmission element in this case will thus carry out the role of a mass which can oscillate and that of a transmission element.

In particular, it is also possible for the transmission element and the mass which can oscillate to be combined as a mass/spring system. The expression "mass/spring system" is understood to mean a system in which a mass together with a spring can be mechanically connected such that oscillations of the mass can be converted to oscillations of the spring.

The electrovolumetric transducer element converts deformation, that is to say strain, to an electrical signal. In general, it may be in the form of a piezo-electric element, a piezo ceramic and/or a piezo stack, which each convert deformation to electrical energy, for example an electrostrictive or magnetostrictive element. The transducer element is preferably a ceramic transducer which comprises two or more layers separated by conductive intermediate layers. Different embodiments or materials, such as monolithic piezo ceramics or piezoelectric polymers, may also be chosen.

The deformation of the electrovolumetric transducer element may be either a tensile strain or expansion, depending on the oscillation of a transmission element, a spring or an elastic bending element which is connected to the transducer element.

The transducer element is preferably held by a holder, in particular in such a way that any oscillation of the mass can at least partially be transmitted via the transmission element to the electrovolumetric transducer element, with the electrovolumetric transducer element being deformed by the oscillation, producing an electrical voltage.

The transducer element is operated optimally such that it is prestressed in compression, in particular by a second elastic element or transmission element.

The holder may be in the form of a housing which is open on one side. This opening ensures free access to and the capability to make contact between the free end of the elastic bending element and the mass which can oscillate. The holder may in this case comprise two or more separate parts, that is to say it need not necessarily have a standard shape or be integral.

The oscillation transmission to the electrovolumetric transducer element can be supplemented by the use of a second transmission element, for example a spring. In an embodiment of the invention such as this, the transducer element is also prestressed in compression, in particular by means of a second spring, which is fitted in between the holder and that side of the elastic bending element which faces away from the electrovolumetric transducer element. A compact configuration is preferable, in which at least a portion of the elastic bending element is clamped in between the second spring and the piezoelectric element, but one end of the elastic bending element is in this case clamped in with the holder, while the other end oscillates freely and can still make contact with a mass which can oscillate.

The apparatus can also be extended without any problems by using two or more electrovolumetric transducer elements and transmission elements jointly. In this case, as already explained, two or more elastic bending elements could make contact with a mass which can oscillate, at their free ends.

Another aspect of the invention is directed to a method for conversion of mechanical energy to electrical energy which uses one of the above-described apparatuses such that any movement of a mass is transmitted via a transmission element to an electrovolumetric transducer element, which converts the movements to a voltage and possible oscillations of the mass to alternating voltages.

The movement of the mass may be characterized by oscillations which are picked-up by the transmission element, for example the elastic bending element, and are transmitted to the piezoelectric element. The movement of the mass may also be transmitted via the elastic bending element to a second spring and to the transducer element, such that the elastic bending element and the second spring produce an oscillation, in particular at resonance, which is transmitted to the transducer element.

The mechanical stimuli which are transmitted to the piezoelectric element may in principle be produced by the elastic bending element and/or the second spring being briefly loaded and then released. This leads to the mass/spring system oscillating outwards in the form of a damped oscillation with an exponentially decaying oscillation amplitude. The electrical alternating voltage which is produced has a similar profile, which decays exponentially over time.

Examples of mechanical stimuli which are used in the invention will be pushing a button manually, or a weight being exceeded.

Overall, the invention results in the advantage that the mechanical stimulus is produced by one or more shocks or by oscillations to which the entire transducer structure is subject. In this case, the inert mass of a mass/spring system, as already described, leads to energy being transmitted to a piezoelectric element, which in turn emits an alternating voltage, whose profile depends on the nature and duration of the stimulus.

The invention allows the spring constants, the oscillating mass and the damping of the system to be designed so as to achieve optimum matching to the respective requirements for the generation of electricity from mechanical energy.

DETAILED DESCRIPTION OF THE DRAWINGS

Figure 1:
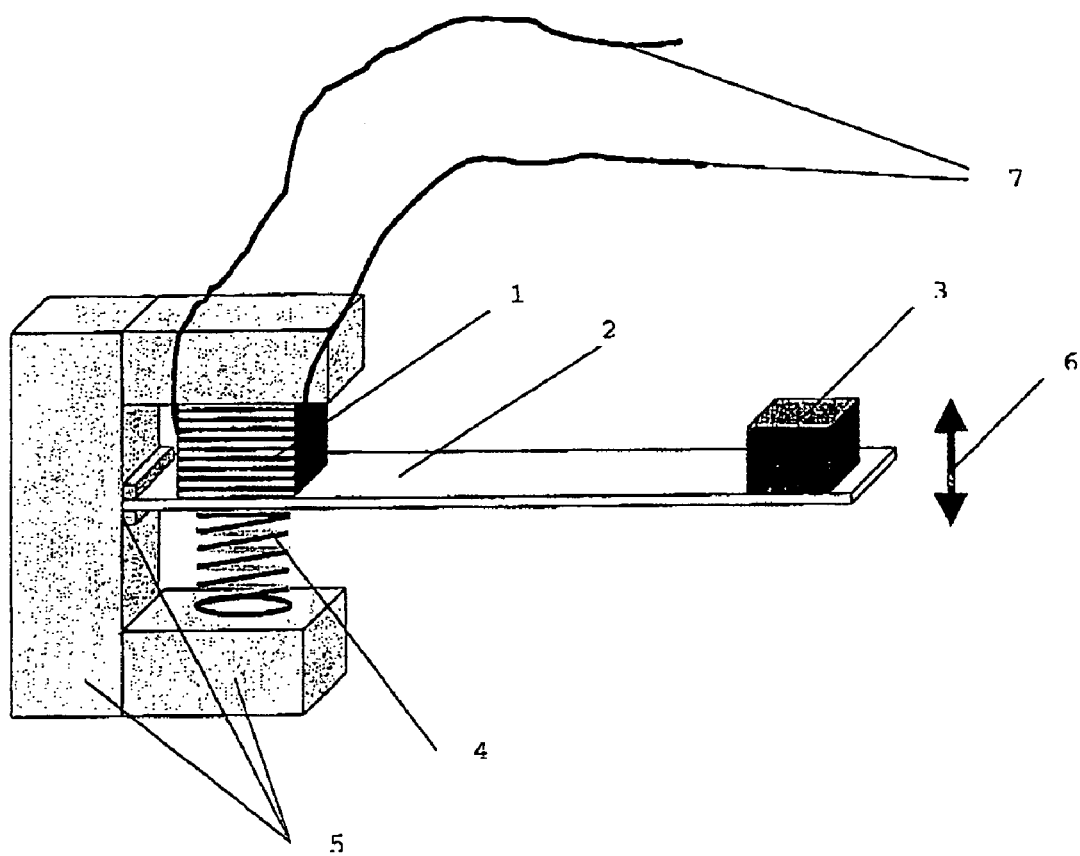
FIG. 1 shows a schematic perspective view in elevation of the invention.

FIG. 1 shows one exemplary embodiment of the invention, illustrating a piezo-electric element (1), an elastic bending element (2) and a spiral spring (4), in a U-shaped holder (5). When the mass (3) is deflected briefly, the elastic bending element (2) starts to oscillate in one of the directions (6), as a result of which energy is periodically transmitted to the spring (4) and to the piezoelectric element (1). The bending element (2) is in engagement with the piezoelectric element by being preferably attached at one end to the piezoelectric element (1), such that that end of the bending element (2) which is connected to the holder is inserted between two protrusions, which are in the form of beams, in the holder (5), and it is thus firmly clamped at this end. The alternating voltage which results from the mechanical oscillations can be tapped off on the wires (7).

In an embodiment of the invention, the transducer element is prestressed in compression by means of a second spring. The second spring is inserted between the holder (5) and that side of the elastic bending element (2) which faces away from the piezoelectric element (1). Although in this arrangement it is possible to have the bending element (2) attached at one end to the piezoelectric element (1), it is also contemplated to have them only in a touching engagement.

Thus, as elastic bending element (2) moves in downward direction (6), it will not cause the piezoelectric element (1) to expand by pulling downward on it, as it otherwise would if they were attached. Nevertheless, the piezoelectric element (1) expands as the prestress is released.

The voltage which is produced on the piezoelectric element as a result of the mechanical oscillations may, in principle, be used, after rectification, directly for supplying electrical loads, or may be used for charging energy stores such as capacitors or electro-chemical energy stores.

The invention may be designed in a miniaturized form so that it can be used optimally on a wheel rim of a motor vehicle, on the axle of rail vehicles, or on vibrating machines. The shaking or vibration which occurs repeatedly leads in each case or permanently to stimulation of the spring/mass system to oscillate, and thus to the availability of an electrical alternating voltage on the piezoelectric element.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An apparatus for conversion of mechanical energy to electrical energy, the apparatus comprising:
   a mass which can oscillate;
   a transmission element for transmission of oscillations;
   an elastic element;
   an electrovolumetric transducer element arranged to be prestressed in compression by the elastic element, and wherein the elastic element is adapted to continuously stress the electrovolumetric transducer element even during oscillation of said mass;
   wherein the electrovolumetric transducer element is in engagement with the transmission element such that any oscillation of the mass is transformed at least partially to a change in the volume of the electrovolumetric transducer element, producing an electrical voltage.

2. The apparatus as claimed in claim 1, in which the transmission element is elastic or is a spring element.

3. The apparatus as claimed in claim 2, in which the transmission element is in the form of a lever.

4. The apparatus as claimed in claim 1, in which the mass is at least part of the transmission element.

5. The apparatus as claimed in claim 1, in which the electrovolumetric transducer element is held by a holder.

6. The apparatus as claimed in claim 1, in which the electrovolumetric transducer element is a piezoelectric element or a magnetostrictive element.

7. A method for conversion of mechanical energy to electrical energy, in which the apparatus as claimed in claim 1 is used, wherein any movement of the mass is transmitted via a first transmission element to an electrovolumetric transducer element, which converts the movement to an electrical voltage.

8. The method as claimed in claim 7, in which the movement of the mass is an oscillation which is picked-up by the first transmission element, and this oscillation is transmitted to the electrovolumetric transducer element.

9. The method as claimed in claim 7, in which the movement of the mass is transmitted via the first transmission element to a second transmission element and to the electrovolumetric transducer element, and the first transmission element and the second transmission element together produce an oscillation which is transmitted to the electrovolumetric transducer element.

10. The apparatus as claimed in claim 1, wherein the engagement between said electrovolumetric transducer element and said transmission element is an attachment.

11. The apparatus as claimed in claim 1, wherein the engagement between said electrovolumetric transducer element and said transmission element is a touching engagement.

12. The apparatus as claimed in claim 2, wherein the transmission element is in the form of a bending beam.

* * * * *